United States Patent
Delbaere et al.

(10) Patent No.: US 12,381,055 B2
(45) Date of Patent: Aug. 5, 2025

(54) METHOD FOR DIAGNOSING AN OPERATING STATE OF AN ELECTRICAL SWITCHING DEVICE AND ELECTRICAL SWITCHING DEVICE FOR IMPLEMENTING SUCH A METHOD

(71) Applicant: Schneider Electric Industries SAS, Rueil Malmaison (FR)

(72) Inventors: Stéphane Delbaere, Meylan (FR); Rémy Orban, Saint Martin d'Uriage (FR); Stéphane Follic, Lumbin (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/376,518

(22) Filed: Jul. 15, 2021

(65) Prior Publication Data

US 2022/0020547 A1   Jan. 20, 2022

(30) Foreign Application Priority Data

Jul. 20, 2020 (FR) .................................. FR2007606

(51) Int. Cl.
  *H01H 47/00* (2006.01)
  *G01R 31/327* (2006.01)
  *H01H 1/00* (2006.01)

(52) U.S. Cl.
  CPC ......... *H01H 47/002* (2013.01); *G01R 31/327* (2013.01); *G01R 31/3274* (2013.01); *H01H 1/0015* (2013.01)

(58) Field of Classification Search
  CPC .............. G01R 31/327; G01R 31/3271; G01R 31/3272; G01R 31/3275; G01R 31/3274;
  (Continued)

(56) References Cited

U.S. PATENT DOCUMENTS 4,025,886 A * 5/1977 Barkan ..................... H01H 1/54
  335/147
5,053,911 A * 10/1991 Kopec ..................... H01H 47/04
  361/187
(Continued)

FOREIGN PATENT DOCUMENTS

EP   2584575 A1   4/2013
EP   3460822 A1   3/2019
(Continued)

OTHER PUBLICATIONS

French Search Report and Written Opinion dated Mar. 11, 2021 for corresponding French Patent Application No. 2007606, 7 pages.

*Primary Examiner* — Judy Nguyen
*Assistant Examiner* — James Split
(74) *Attorney, Agent, or Firm* — Troutman Pepper Locke LLP

(57) ABSTRACT

A method for diagnosing an operating state of a switching device including separable contacts, which are driven by an electromagnetic actuator including a coil connected to an electronic control device, and sensors that measure a coil voltage and an intensity of a coil current. The method includes:
  a) receiving an order to open the switching device via the electronic control device;
  b) controlling the electromagnetic actuator so that it opens;
  c) measuring and recording the coil voltage and coil current values
  d) calculating and recording values of a magnetic flux through the coil, by integrating the recorded values of the coil current, the coil voltage and resistance and inductance values of the coil; and
  e) evaluating and recording positions of a core of the electromagnetic actuator according to a data table,
  (Continued)

which defines a bijective relation between the position of the core, the magnetic flux and the coil current.

18 Claims, 12 Drawing Sheets

(58) Field of Classification Search
CPC ............ G01R 31/3277; G01R 31/3278; H01H 1/0015; H01H 47/002
See application file for complete search history.

(56) References Cited

U.S. PATENT DOCUMENTS

| | | | | |
|---|---|---|---|---|
| 5,424,637 A * | 6/1995 | Oudyn | ................... | H01F 7/1844 |
| | | | | 324/207.16 |
| 6,518,748 B2 * | 2/2003 | Butzmann | ................. | F01L 9/20 |
| | | | | 324/207.16 |
| 6,657,847 B1 * | 12/2003 | Wright | ................... | H01F 7/1844 |
| | | | | 361/160 |
| 6,859,350 B1 * | 2/2005 | Corbetta | .............. | H01H 33/593 |
| | | | | 361/139 |
| 8,688,391 B2 * | 4/2014 | Elsner | ................... | H01H 1/0015 |
| | | | | 702/34 |
| 8,718,968 B2 * | 5/2014 | Poeltl | ................... | H01H 1/0015 |
| | | | | 702/149 |
| 9,733,292 B2 * | 8/2017 | Delbaere | ................. | G06F 15/00 |
| 11,948,757 B2 * | 4/2024 | Rushabh | ............ | G01R 31/3274 |
| 2017/0199231 A1 | 7/2017 | Brunner et al. | | |
| 2019/0131047 A1 * | 5/2019 | Priest | ..................... | H01F 7/064 |
| 2020/0194191 A1 * | 6/2020 | Ashtekar | ............ | G01R 31/3333 |

FOREIGN PATENT DOCUMENTS

| | | |
|---|---|---|
| WO | 9824106 A1 | 6/1998 |
| WO | 2015189027 A1 | 12/2015 |

* cited by examiner

METHOD FOR DIAGNOSING AN OPERATING STATE OF AN ELECTRICAL SWITCHING DEVICE AND ELECTRICAL SWITCHING DEVICE FOR IMPLEMENTING SUCH A METHOD

TECHNICAL FIELD

The present invention relates to a method for diagnosing an operating state of an electrical switching apparatus and to electrical switching apparatus for implementing such a method.

The invention more particularly relates to electrical contactors.

BACKGROUND

Such electrical switching apparatuses comprise an electromagnetic actuator comprising a coil and are configured to switch between an open state and a closed state, for example in order to control the supply of electrical power to an electrical load. Generally, the electrical contacts comprised fixed contacts and movable contacts, the latter being attached to a movable portion of the actuator that moves under the effect of a magnetic field created by the coil when a suitable electrical current flows through the latter. To guarantee a sufficient contact pressure between the electrical contacts, the movable portion of the actuator overruns by a distance, called the overrun, between the moment at which the movable contacts make contact with the fixed contacts, and the moment at which the actuator reaches its stable closed position. This overrun corresponds to a contact compression.

In each switching cycle, the contactor undergoes wear under the effect of various factors; for example, the electrical contacts wear under the effect of electric arcs generated as the electrical contacts open, the wear of the contactor manifesting itself by a loss of contact compression.

It would be desirable to be able to automatically estimate the wear level of a contactor while it is in operation, in order to be able to make provision for suitable maintenance during the life of said contactor and/or to detect the appearance of malfunctions.

It is known to incorporate a position sensor into the electromagnetic actuator, in order to directly measure the movement of the movable parts of the actuator and to deduce contact compression therefrom. However, an additional sensor engenders an additional cost, and it is not always possible to integrate a new sensor into an existing contactor.

EP-2584575-A1 describes a method for diagnosing wear based on measurements of the time between peaks in the current flowing through the coil of the actuator in the opening phase. Such a diagnosing method only allows the time of the start of the movement and the time of the end of the movement of the core to be determined. Thus, one drawback of this method is that it does not allow the precise position of the core during the opening phase to be determined. This makes it more difficult to obtain reliable information on the state of the contacts and therefore on the wear state of the contactor.

SUMMARY

It is these problems that the invention more particularly remedies, by providing a diagnosing method that is more precise.

To this end, the invention relates to a method for diagnosing an operating state of an electrical switching apparatus. The electrical switching apparatus is configured to be coupled to an electrical conductor and comprises:

separable contacts that are associated with the electrical conductor and that are driven by an electromagnetic actuator comprising a coil connected to an electronic control device, which control device is configured to apply a coil command voltage across the terminals of the coil, sensors that are configured to measure the coil voltage and a magnitude of a coil current flowing through the coil.

According to the invention, the method comprises steps consisting in:

receiving an order to open the switching apparatus, the switching apparatus initially being in a closed state, the order to open being received by the electronic control device;

after the order to open has been received, commanding the electromagnetic actuator to open, by means of the electronic control device;

as the switching apparatus switches to the open state, measuring and storing values of the coil voltage and coil current;

computing and storing values of a magnetic flux passing through the coil, by integration of the stored values of the coil current and coil voltage and of values of the resistance and inductance of the coil that are stored beforehand in the electronic control device;

on the basis of the stored values of the magnetic flux and coil current, evaluating and storing positions of a core of the electromagnetic actuator depending on a data table characteristic of the electromagnetic actuator, the data table being stored beforehand in the electronic control device and defining a bijective relationship between the position of the core, the magnetic flux and the coil current.

By virtue of the invention, the magnetic flux $\phi$ is computed throughout the opening phase on the basis of the measurements of coil voltage and of coil current. A value of the position of the movable core is deduced therefrom on the basis of the data table, which relates bijectively the position of the core, magnetic flux and coil current. The variation in the position of the mobile core in the opening phase is thus determined automatically, precisely, and without having to install a specific new sensor such as a position sensor. According to some advantageous but non-mandatory aspects of the invention, such a diagnosing method may incorporate one or more of the following features, either alone or in any technically permissible combination:

the step of computing the magnetic flux comprises an initial substep, referred to as the self-correction substep, followed by a computing substep, the self-correction substep consisting in, provided that the coil current is higher than a low threshold, itself strictly higher than a current referred to as the "stall" current, below which the movable core is repulsed to the open position by a return member of the electromagnetic actuator, evaluating and storing an initial value of the magnetic flux, which value is referred to as the "initial flux", so that, when the coil current decreases below the stall current, the computation by integration of the magnetic flux $\phi$ in the computing phase takes into account the value of the initial flux;

the electronic control device is configured to, when the switching apparatus is in the closed state, make the coil voltage vary so that the coil current varies between the low threshold and a high threshold, which is strictly higher than the low threshold, and, after the order to open has been received, the electronic control device commands the electromagnetic actuator to open when the coil current is higher than or equal to 80%, preferably higher than 95%, and more preferably higher than 98%, of the high threshold;

the coil voltage is made to vary periodically, for example by chopping, the coil current also varying periodically between the low and high thresholds, and, after the order to open has been received, the electronic control device commands the electromagnetic actuator to open at the latest at the end of a predefined duration after the order to open is received, the predefined duration being equal to one period of the coil voltage;

the electronic control device is configured to compute a time, referred to as the "release" time, equal to the time passed between the time at which the electronic control device commands the electromagnetic actuator to open and the time at which the electromagnetic actuator reaches the open position;

the method comprises a step consisting in computing, by derivation with respect to time of the values of the position of the switching apparatus stored in the electronic control device, a profile of the speed of movement of the switching apparatus and a profile of the acceleration of the switching apparatus, and in storing the speed and acceleration profiles of the switching apparatus in the electronic control device;

the method comprises a step consisting in computing a value of a speed referred to as the "separation" speed, which speed is equal to a speed of movement of the core when the core is in a position referred to as the "max overtravel" position corresponding to a movement of the core, from its closed position to its open position, substantially equal to 2 mm; and the method comprises a step consisting in detecting, in the phase of opening of the switching apparatus, a local minimum in the speed of the core between the start of the movement of the core and the moment at which the core reaches abutment in the open position.

The invention also relates to an electrical switching apparatus for implementing a diagnosing method such as described above, the switching apparatus comprising:

separable contacts, which are moved between an open position and a closed position by an electromagnetic actuator comprising a coil and a movable core that is attached to the separable contacts, the switching apparatus having a structure that limits the generation of eddy currents;

a command circuit for controlling the voltage across the terminals of the coil, which voltage is referred to as the "coil voltage", the command circuit comprising a device referred to as the "release" device, which may be selectively activated in order to make drop the electrical current flowing through the coil, which is referred to as the "coil current", the coil voltage and release device being activated or deactivated depending on the states of the command circuit;

sensors for measuring the coil current and coil voltage;

an electronic control device, which is configured to receive orders to open and close the switching apparatus, to receive the values of the measurements of coil current and coil voltage, and to control the states of the command circuit;

wherein the switching apparatus is configured to implement a diagnosing method comprising steps consisting in:

a) receiving an order to open the switching apparatus.
b) commanding the electromagnetic actuator to open;
c) measuring and storing values of the coil voltage and coil current;
d) computing and storing values of a magnetic flux passing through the coil, by integration of the stored values of the coil current and coil voltage and of values, which are stored beforehand in the electronic control device, of the resistance and inductance of the coil;
e) evaluating and storing positions of the core depending on a data table characteristic of the electromagnetic actuator, the data table being stored beforehand in the electronic device and defining a bijective relationship between the position of the core, the magnetic flux and the coil current.

This switching apparatus has the same advantages as those mentioned above with respect to the diagnosing method of the invention.

BRIEF DESCRIPTION OF THE DRAWINGS

The invention will be better understood and other advantages thereof will become more clearly apparent from the following description of one embodiment of a method for diagnosing an operating state of a contactor, and of a contactor configured to implement such a method, which description is given solely by way of example and with reference to the appended drawings, in which.

DETAILED DESCRIPTION

Figure 1:
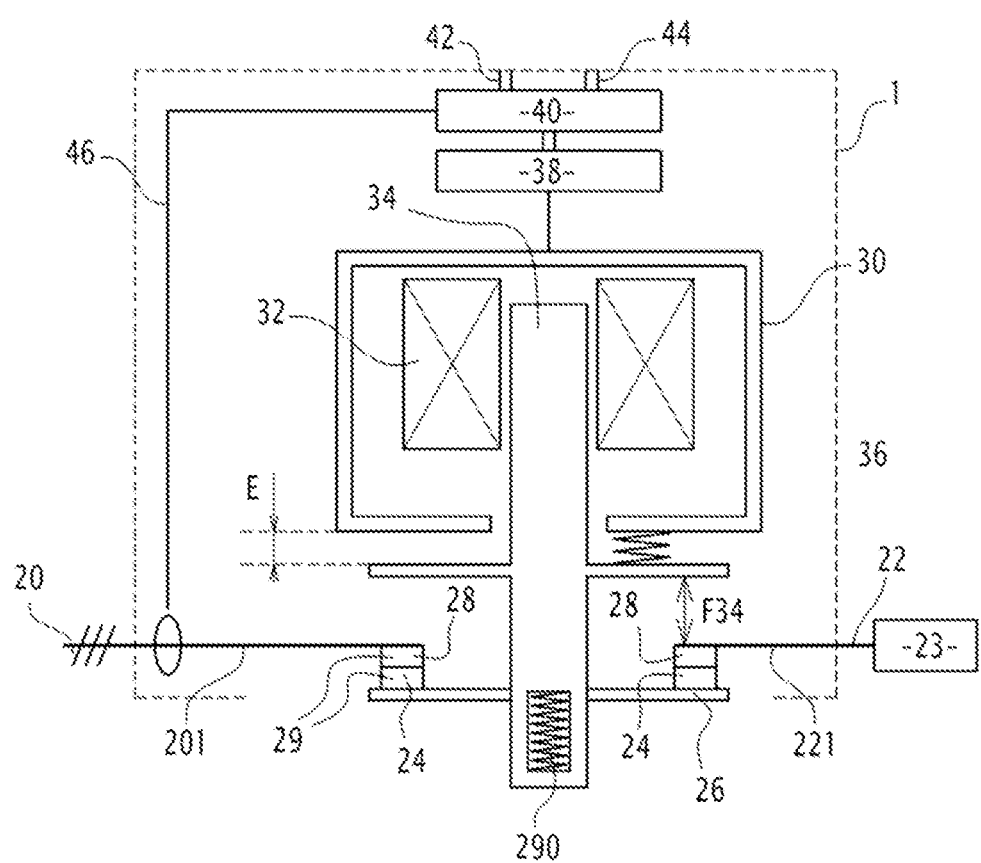
FIG. 1 is a schematic representation of an electric switching apparatus comprising an electromagnetic actuator, according to embodiments of the invention.

A contactor 1 is shown in FIG. 1. The contactor 1 is an example of an electrical switching apparatus intended to control the supply of electrical power from an electrical power source to an electrical load 23. The electrical power source has not been illustrated to simplify the figures. The power source is for example a mains grid, whereas the electrical load 23 is for example an electric motor that it is desired to control and/or protect by means of the contactor 1. The contactor 1 is generally housed in a casing, which has been represented here by a dashed rectangle. The contactor 1 is configured to be coupled, on the one hand, to an upstream electrical conductor 20 connected to an electrical power source and, on the other hand, to a downstream line 22 connected to the electrical load 23. When the contactor 1 lets electrical current pass and the electrical load 23 is supplied with power, the contactor 1 is in a state referred to as the "closed" state, whereas when the contactor 1 prevents the passage of electrical power to the electrical load, the contactor 1 is in a state referred to as the "open" state.

The electrical conductor 20 and the downstream line 22 comprise the same number of phases. When the electrical power source is multiphase, the electrical conductors 20 and the downstream line 22, which each comprise conductive wires that are insulated from one another, have as many conductive wires as each other, each conductive wire of the downstream line 22 being associated with one respective wire of the upstream electrical conductor 20. Whatever the number of phases, the contactor 1 is configured to interrupt, or to let pass, the electrical current conjointly in each of the phases.

In the illustrated example, the upstream electrical conductor 20 is three-phase. A single of the conductive wires of the electrical conductor 20, which has been referenced 201, is shown in FIG. 1. Only the conductive wire of the power line 22 associated with the conductive 201 has been shown, this conductive wire of the power line 22 being referenced 221.

The rest of the description will be given with reference to the conductive wires 201 and 221, which are associated with the same phase of the supply current, but it will be understood that what is described may be transposed to the other phases of the supply current.

For each phase, the contactor 1 comprises movable contacts 24, which are placed on a movable bar 26, and fixed contacts 28, which are attached to the upstream and downstream conductors 20, 22, respectively. Each of the movable and fixed contacts 24, 28 comprises contact pads 29, which are here made of metal, and preferably from a silver alloy or any equivalent material.

The movable bar 26 is movable between a closed position, in which the movable contacts 24 are electrically connected to the fixed contacts 28 and electrical power is able to flow through the movable bar 26 of the upstream electrical conductor 20 to the downstream line 22, and an open position in which the removable contacts 24 are separated from the fixed contacts 28.

When the movable bar 26 is in closed position, the contactor 1 is in the closed state, whereas when the bar 26 is in open position, the contactor 1 is in the open state. The passage from the open state to the closed state is a phase of closing of the contactor 1, whereas the passage from the closed state to the open state is a phase of opening the contactor 1.

In practice, in each cycle comprising a closing and opening phase, the contact pads 29 wear, for example under the action of electric arcs generated as the contactor opens, or even because of material being torn away as a result of micro-welds. The consequence of this loss of material is that the thickness of the contact pads 29 decreases throughout the life of the contactor 1, this increasing the amplitude of the movement of the bar 26 during opening and closing phases. To remedy this, the contactor 1 comprises a mechanism 290, which has been schematically represented by a spring in FIG. 1, that is attached to the bar 26 and that allows the fixed and movable contacts 28, 24 to be kept in electrical contact with a sufficient contact pressure.

When the thickness of the contact pads 29 is insufficient or when the surface finish of the pads 29 is poor, the risk of malfunction of the contactor 1 increases and it is recommendable to replace the contactor 1; it is for these reasons that a diagnosis of the compression state of the contacts of the contactor 1 allows the advance of the degradation of the contactor 1 to be evaluated.

The movable bar 26 is driven by an electromagnetic actuator 30, which comprises a command electromagnet with a coil 32, a core 34 attached to the movable bar 26 and a return member 36, a spring or equivalent for example. The coil 32 is configured to generate a magnetic field when it is powered with an electrical command current, in order to cause the core 34, and therefore the movable bar 26, to move. The movements of the core 34 between the open and closed positions have been represented by a double-headed arrow F34. In other words, the movable contacts 24 and the associated fixed contacts 28 together form separable contacts, which are associated with the electrical conductor 20 and which are moved between an open position and a closed position by the electromagnetic actuator 30, which comprises a coil 32 and a movable core 34 that is attached to the separable contacts.

In FIG. 1, the contactor 1 has been shown in an intermediate configuration between the stable open and closed states of the contactor 1, in which intermediate configuration the fixed and movable contacts 28, 24 are electrically connected, but the core 34 is not in abutment in the closed position. The mechanism 290 permits an overrun of the core 34 between the moment at which the fixed contacts 28 make contact with the movable contacts 24, and the moment at which the actuator 30 is in its stable closed position. This overrun, which corresponds to the contact compression, is denoted E in FIG. 1.

The electromagnetic actuator 30 is controlled by way of a supply circuit 38, itself controlled by an electronic control device 40. The coil 32 is thus connected to the electronic control device 40.

According to some embodiments, the electronic control device 40 comprises a central processing unit (CPU), such as a programmable microcontroller, a microprocessor or the like, and a computer memory forming a storage medium for computer-readable data.

According to some examples, the memory is a ROM memory, a RAM memory, or an EEPROM or flash non-volatile memory or the like. The memory comprises executable instructions and/or computer code for ensuring the operation of the control device 40 in accordance with one or more of the embodiments described below when executed by the central processing unit.

As variants, the electronic control device 40 may comprise a digital signal processor (DSP), or a field-programmable gate array (FPGA), or an application-specific integrated circuit (ASIC), or any equivalent element.

The electronic control device 40 is itself connected to a power supply rail 42 and comprises an interface 44 configured to receive, from a user, orders to open or close the switching apparatus 1. The electronic control device 40 is here shown as being integrated into the contactor 1. As a variant, the control device 40 is remote, i.e. it is not integrated into the same casing as the electromagnetic actuator 30.

The power supply rail 42 has a preferably stable and DC voltage and is intended to supply the electronic control device 40 and the supply circuit 38 with power. The interface 44 has been represented here by command electrodes. For example, an electrical command voltage may be applied across the command electrodes. Optionally, the interface 44 comprises wireless communication means.

In certain embodiments, the contactor 1 also comprises current sensors 46, configured to measure a current flowing through each of the phases of the upstream line 20, or in other words a current flowing through each of the conductive wires 201 of the upstream line 20. In other embodiments, the current sensors 46 and the electronic control device 40 are integrated into a casing separate from the contactor 1.

When the coil 32 is supplied with electrical power delivered by the power supply rail 42, an excitation current passes through the coil 32, which generates an electromagnetic force that tends to attract the core 34 and the bar 26 from the open position to the closed position. A return member 36, represented here by a spring, exerts a return force that opposes the force of attraction of the electromagnet.

A coil current $I_{BOB}$ is defined as being an excitation current flowing through the coil 32.

A start current ID is defined as being a threshold of the coil current $I_{BOB}$ that, when the actuator 1 is in the open state, allows the actuator 1 to move to the closed state, as soon as the coil current $I_{BOB}$ increases above the start current ID.

A stall current $I_S$ is defined as being a threshold of the coil current $I_{BOB}$ that, when the actuator 1 is in the closed state, allows the actuator 1 to move to the open state, as soon as the coil current $I_{BOB}$ decreases below the stall current Is.

Thus, when that the actuator 1 is in the open state, provided that the coil current $I_{BOB}$ remains below the start current ID, the movable core 34 is repulsed to the open position by the return member 36 of the actuator 30 and the contactor 1 remains in the open state. If the coil current $I_{BOB}$ increases above the start current ID, and the core 34 then moves from its open position to its closed position. Such a situation corresponds to a phase of closing the contactor 1.

In contrast, when the actuator 1 is in the closed state, provided that the coil current $I_{BOB}$ remains higher than the stall current Is, the contactor 1 remains in the closed state. If the coil current $I_{BOB}$ decreases below the stall current Is, the electromagnetic force of the coil 32 drops below the return force of the member 36 and of the mechanism 290; the core 34 is then repulsed from its closed position to its open position under the effect of the return member 36 and of the mechanism 290. Such a situation corresponds to a phase of opening the contactor 1.

Generally, the start current ID is higher, in absolute value, then the stall current Is. The values of the start and stall currents ID, Is are adjusted during the design of the actuator 1, especially by adjusting the properties of the coil 32 or the return forces of the member 36 and of the mechanism 290.

Figure 2:
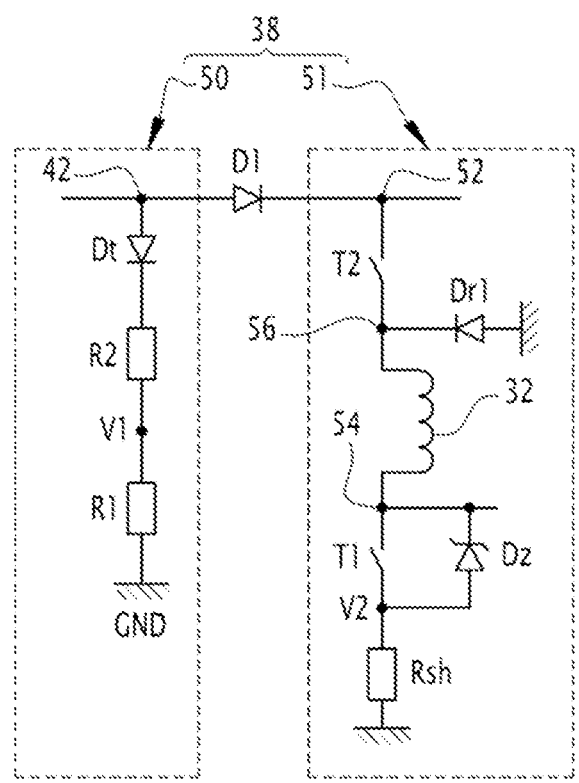
FIG. 2 is a schematic view of an example of the command circuit for controlling the electromagnetic actuator of the switching apparatus of FIG. 1.

An exemplary embodiment of the supply circuit 38 is schematically shown in FIG. 2. The architecture of the supply circuit 38 is nonlimiting, and other arrangements of the various components of the supply circuit 38 are possible, and indeed other electrical or electronic components may be used to perform the same functions.

The supply circuit 38 preferably comprises a measurement circuit 50, shown in the left-hand dashed rectangle, configured to measure the value of the electrical voltage between the supply rail 42 and an electrical ground GND of the supply circuit 38.

For example, the measurement circuit 50 comprises two resistors R1 and R2 that are connected in series with a diode Dt between the power supply rail 42 and the electrical ground GND. A first measurement point, here placed between the resistors R1 and R2, allows a first measurement voltage V1 representative of the voltage present between the power supply rail 42 and the electrical ground GND to be collected. Since the electrical voltage present between the rail 42 and the ground GND is related to the coil voltage $U_{BOB}$, the measurement circuit 50 is by extension an example of a sensor configured to measure coil voltage $U_{BOB}$.

The supply circuit 38 comprises a command circuit 51, which includes the coil 32. A diode D1 may be placed on the power supply rail 42 between the command circuit 51 and the measurement circuit 50 in order to prevent any return of current to the latter. The diodes D1 and Dt are preferably of the same type.

The command circuit 51 is here shown in a configuration referred to as the "release" configuration, which is described in more detail further on in the present description.

The command circuit 51 comprises a supply terminal 52, which is connected to the power supply rail 42. The coil 32 comprises two terminals 54 and 56. A measurement of the voltage between the terminals 54 and 56 thus allows a coil voltage, which is denoted $U_{BOB}$, to be measured.

The terminal 54 is connected to ground GND via a switch t1 referred to as the "release" switch. In many embodiments, a resistor Rsh, referred to as the shunt resistor, is connected in series with the release switch T1 in order to collect a second measurement voltage V2 representative of the electrical current flowing through the coil 32, or in other words representative of the coil current $I_{BOB}$. In the illustrated example the shunt resistor Rsh is connected between the release switch T1 and ground GND. The resistor Rsh is an example of a sensor configured to measure the magnitude of the coil current $I_{BOB}$ flowing through the coil 32.

The terminal 56 is, on the one hand, connected to the terminal 52 by way of a supply switch T2 and, on the other hand, connected to ground GND by way of a diode, which is referred to as the "flyback" diode Drl. The flyback diode Drl has a blocking direction oriented toward the terminal 56.

The switches T1 and T2 are switches that are controlled by a command signal originating from the electronic control device 40. In other words, the electronic control device 40 is configured to control the states of the command circuit 51.

According to some examples of implementation, the switches T1 and T2 are semiconductor power switches, such as MOSFETs, or thyristors, or insulated-gate bipolar transistors (IGBT), or any other equivalent devices.

The command circuit 51 comprises a "release" device Dz, which here takes the form of a Zener diode connected in parallel to the release switch T1. Thus, when the release switch T1 is opened, the coil current $I_{BOB}$ passes through the release device Dz, whereas when the release switch T1 is closed, the release device Dz is short-circuited and no current passes through the release device Dz. The release device Dz is thus selectively activatable to make the coil current $I_{BOB}$ drop.

In the context of the present invention, the characteristic quantities of the components of the supply circuit 38 are considered to be known. In particular, the coil 32 has a resistance denoted $R_{BOB}$ and an inductance denoted $L_{BOB}$. The resistance $R_{BOB}$ and inductance $L_{BOB}$ especially depend on the geometry of the coil 32, on the materials used, on temperature, etc. The values of the resistance $R_{BOB}$ and inductance $L_{BOB}$ are thus considered to be known.

Figure 3:
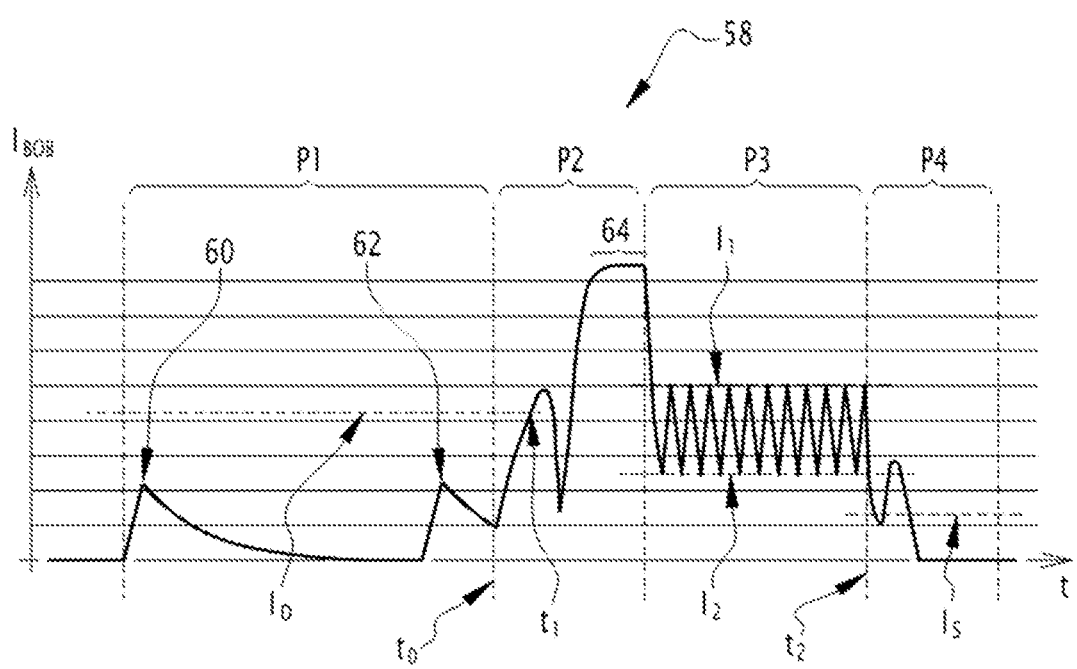
FIG. 3 is a graph showing the variation in an electrical command current of the electromagnetic actuator of FIG. 2, in a plurality of operating phases.

FIG. 3 shows a graph 58 illustrating the variation in the coil current $I_{BOB}$ flowing through the coil 32 over time (t) in various successive operating phases of the contactor 1, which phases are denoted P1, P2, P3 and P4, in the case where the contactor is switched to the closed state, then switched back to the open state.

The phase P1 is an initial phase, during which the contactor 1 is stably in the open state, i.e. the coil current $I_{BOB}$ does not exceed the start current $I_D$. In FIG. 3, the coil current $I_{BOB}$ contains transient peaks 60 and 62, which are lower than the start current $I_D$ and which are related to operations for testing the contactor 1, these testing operations not being described in detail in the present description.

The phase P2 corresponds to a closing phase, after an order to close has been received by the contactor 1. The phase P2 starts when the electronic control device 40 receives, at a time $t_0$, an order to close via the interface 44.

The electronic control device 40 is configured to apply the command coil voltage $U_{BOB}$ to the terminals of the coil 32. For example, the control device 40 then commands the release switch T1 and the supply switch T2 to close. The coil voltage $U_{BOB}$ is then equal to the voltage delivered by the power supply rail 42, minus the voltage across the terminals of the shunt resistor Rsh. The coil current $I_{BOB}$, which is initially zero, then increases to exceed the start current $I_D$ at a time $t_1$, from which the core 34 begins to move from its open position to its closed position.

Next in the closing phase P2, the movable contacts 26 reach abutment against the fixed contacts 28; the contactor 1 is then in the closed state. The core 34 continues to move until it makes contact with the fixed portion 30 of the magnetic circuit, this corresponding to the overrun that compresses the electrical contacts.

More generally, when the electrical power source comprises a plurality of electrical phases, the pads 29 associated with each of the electrical phases do not all have the same wear, or in other words do not all have the same compression. The exact time of the closure of each of the electrical phases differs depending on the electrical phase.

In a last phase 64 of the closing phase P2, transitory effects have ended, and the coil current $I_{BOB}$ exhibits a plateau value, equal to the coil voltage $U_{BOB}$ divided by the coil resistance $R_{BOB}$ and strictly higher than the stall current Is. The contactor 1 is then stably in the closed state.

In the phase 64, the coil 32 consumes electrical power, in particular via Joule heating, the power consumed by the coil 32 via Joule heating being equal to $R_{BOB} \times (I_{BOB})^2$. The contactor 1 remains in the closed state provided that the coil current $I_{BOB}$ is kept above the stall current Is. It is therefore possible to decrease the power consumption of the coil 32 while keeping the contactor 1 stably in the closed state $I_{BOB}$, by decreasing the magnitude of the coil current $I_{BOB}$, provided that the coil current $I_{BOB}$ remains higher than the stall current Is.

This is for example achieved by varying the coil voltage $U_{BOB}$, so as to decrease as much as possible the coil current $I_{BOB}$ while maintaining it above the stall current Is. Such a situation corresponds to a holding phase P3.

In the illustrated example, the variation in the coil voltage $U_{BOB}$ is achieved by alternatively opening and closing the supply switch T2, this creating a periodic signal, chopping the coil voltage $U_{BOB}$ with a square-wave profile at a frequency F3.

In the holding phase P3, when the supply switch T2 is open, the release switch T1 remains closed. The command circuit 51 is then in a mode referred to as the "flyback" mode. The command circuit 51 being limited to the coil 32 connected to the flyback diode Drl and to the shunt resistor Rsh. The coil current $I_{BOB}$ then decreases, the electrical energy mainly being dissipated by the resistance $R_{BOB}$ of the coil 32. The supply switch T2 is then closed before the coil current $I_{BOB}$ decreases below the stall current Is, and the coil current $I_{BOB}$ once again increases.

As a result, the coil current $I_{BOB}$ varies periodically at a frequency equal to the frequency F3 of the coil voltage $U_{BOB}$, the coil current $I_{BOB}$ here having a saw-tooth profile, varying between a low threshold $I_1$, strictly higher than the stall current $I_S$, and a high threshold $I_2$, higher than the low threshold $I_1$. The low threshold $I_1$ is for example chosen to be 5% higher than the stall current $I_S$. The high threshold $I_2$ especially depends on the characteristics of the coil 32, such as the coil resistance $R_{BOB}$ and the coil inductance $L_{BOB}$.

The periodic nature of the coil current $I_{BOB}$ causes mechanical vibration of the electromagnetic actuator 30. To prevent this vibration from generating noise perceivable to the human ear, the frequency F3 is advantageously chosen to be lower than 100 Hz, or higher than 25 kHz. In the illustrated example, the frequency F3 is 100 Hz.

The opening phase of P4 starts when the electronic control device 40 receives in order to open, at a time $t_2$.

The electronic control device 40 commands the electromagnetic actuator 30 to open, this being achieved here by opening the supply switch T2 and opening the release switch T1 so as to make drop the voltage across the terminals of the coil 32. The coil current $I_{BOB}$ then flows through the flyback diode Drl, the coil 32, the flyback device Dz and the shunt resistor Rsh. The control circuit 51 is then in a mode referred to as the "release" mode, in which the coil current $I_{BOB}$ decreases faster than in the flyback mode.

When the coil current $I_{BOB}$ drops below the stall current Is, the return member 36 and the mechanism 290 repulse the movable contacts 24 from their closed position to their open position.

Once transient induction effects have ended, the coil current $I_{BOB}$ is zero, and the contactor 1 is once again stably in the open state.

Figure 4:
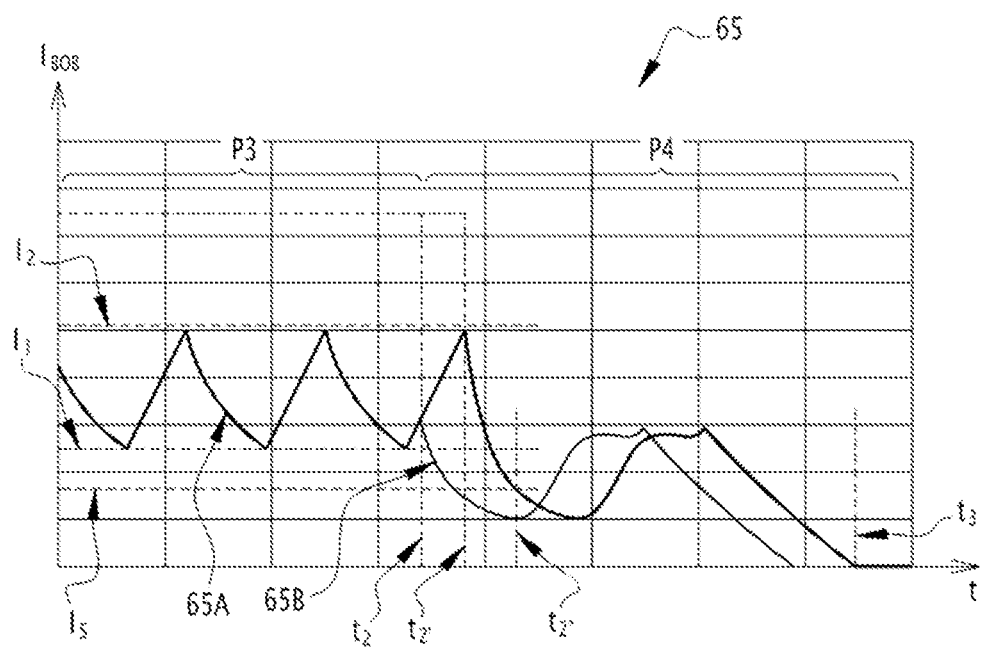
FIG. 4 is a graph showing, under two different sets of conditions, the variation in the electrical command current of the electromagnetic actuator of FIG. 2, in two operating phases.

FIG. 4 shows a graph 65 illustrating the variation in the coil current $I_{BOB}$ flowing through the coil 32 over time t during the passage from the holding phase P3 to the opening phase P4. A curve 65A (thick line) shows the variation in the coil current $I_{BOB}$ when the electronic control device 40 commands the contactor 1 to open according to an advantageous opening strategy that is detailed below. A curve 65B (thin line) shows the variation in the coil current $I_{BOB}$ when the electronic control device 40 commands the contactor 1 to open without any particular strategy, as is the case in the prior art.

As explained above, during the holding phase P2 the coil current $I_{BOB}$ varies periodically between the low and high thresholds $I_1$, $I_2$. The curves 64A and 65B are superposed during the holding phase P3.

In the prior art, when an order to open is received at the time t2, the control device 40 immediately commands the switches T1 and T2 to open. The coil current $I_{BOB}$ immediately starts to decrease, this situation corresponding to the curve 65B.

Advantageously, in the context of the present invention, the control device 40 commands the contactor 1 to open when the coil current $I_{BOB}$ is as high as possible. By "as high as possible", what is meant here is that the current $I_{BOB}$ is higher than or equal to 80%, preferably higher than 95%, and more preferably higher than 98%, of the high threshold $I_2$.

The time at which the electronic control device 40 commands the contactor 1 to open defines a time $t_2'$, which is subsequent to the time $t_2$.

In order to not excessively delay the time $t_2'$, the electronic control device 40 commands the electromagnetic actuator 30 to open at the latest at the end of a predefined duration after the order to open is received, the predefined duration being equal to one period of the coil voltage $U_{BOB}$. In other words, the electronic control device 40 preferably commands the electromagnetic actuator 30 to open on the first high-threshold peak $I_2$ after the order to open is received at the time $t_2$.

In the illustrated example, in the holding phase P3, the coil current $I_{BOB}$ varies at a frequency F3 of 100 Hz. The time interval between two high-threshold peaks $I_2$ is therefore equal to 10 ms. Thus, the offset between the times $t_2$ and $t_2'$ is at most 10 ms, this corresponding to one half-period of a 50 Hz supply current. Such an offset is acceptable on account of the operating constraints of the contactor 1.

A "stall" time $t_2''$ is also defined as being a time at which the coil current $I_{BOB}$ drops, for the first time after the time $t_2^1$, below the stall current Is. Lastly a time t3 is defined as being a time from which the coil current $I_{BOB}$ remains stably at zero. Thus, the core 34 remains stationary between the times $t_2'$ and $t_2''$ and starts to move after the time $t_2''$.

The electrical and electromagnetic quantities of the coil 32 will now be described.

A magnetic flux $\phi$ is generated when the coil current $I_{BOB}$ flows through the coil 32. The value of the magnetic flux $\phi$ especially depends on the value of the coil current $I_{BOB}$ and on the position of the movable core 34.

For example, the value of the magnetic flux $\phi$ is related to the values of the coil voltage $U_{BOB}$ and coil current $I_{BOB}$ by the following equation, denoted Math 1 below:

$$U_{BOB} = R_{BOB} \cdot I_{BOB} + N \frac{d\phi}{dt} \quad \text{[Math 1]}$$

in which N is the number of turns of the coil 32 and $\phi$ is the magnetic flux passing through each turn of the coil 32.

A position x is defined as a position of the movable core 34 with respect to the coil 32. In many embodiments, the movable core 34 may moved translationally with respect to the coil 32 along an axis of movement. The position x is then defined along this axis of movement. By convention, the position x is zero when the contactor 1 is in the open state. For each of the electrical phases of the contactor 1, the position of the movable contacts 24 is thus related to the position x. By extension, the position x also represents a position of the electromagnetic actuator 30 or of the contactor 1.

By deriving $\phi$ in the equation Math 1, a general equation Math 2 describing the electromagnetic quantities in the actuator 1 is obtained:

$$U_{BOB} = R_{BOB} \cdot I_{BOB} + N \frac{d\phi}{dI_{BOB}} \frac{dI_{BOB}}{dt} + N \frac{d\phi}{dx} \frac{dx}{dt} + N \frac{d\phi}{di_f} \frac{di_f}{dt} \quad \text{[Math 2]}$$

in which the last term $$\frac{d\phi}{di_f} \frac{di_f}{dt}$$

contains eddy currents, which are denoted $i_f$.

In the context of the present invention, the contactor 1 has a structure that limits the generation of eddy currents $i_f$, this allowing the last term of the equation Math 2 to be neglected. According to some nonlimiting examples, the contactor 1 has a sheet-based laminated structure, which is produced by stacking cut sheets and which has a very low conductivity along the stacking axis of the sheets, especially because of sheet edge discontinuities. The resulting low overall conductivity is the cause of the few eddy currents generated by this type of contactor 1.

Figure 5:
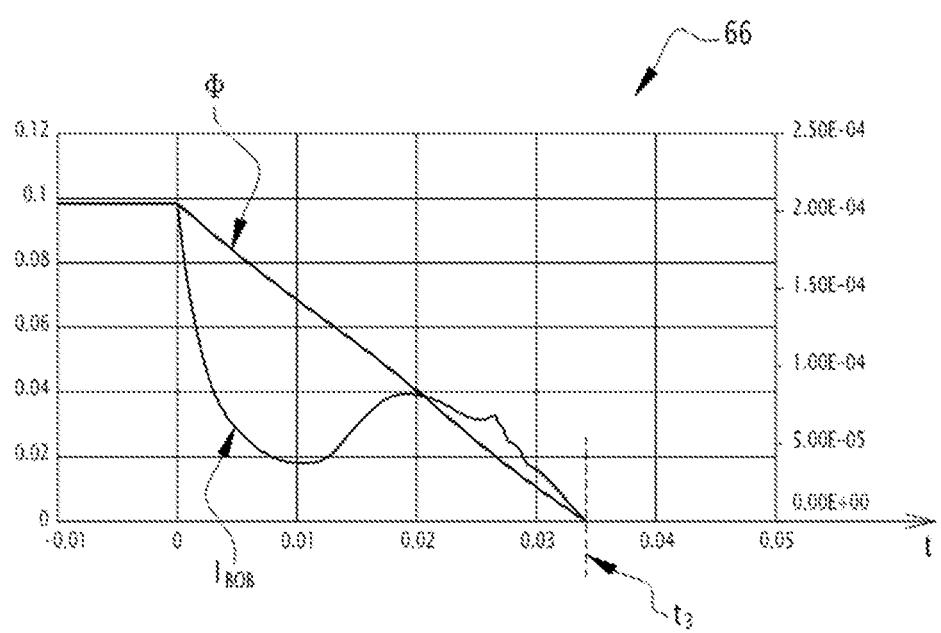
FIG. 5 is a graph showing the variation in an electrical command current and in a magnetic flux of the electromagnetic actuator of FIG. 2, as measured in a phase of opening the actuator.

An illustration of this effect of decrease in eddy currents $i_f$ is shown in FIG. 5, which shows a graph 66 illustrating the variation in the coil current $I_{BOB}$ and in the magnetic flux in a phase of opening the contactor 1. The absence of eddy currents $i_f$ manifests itself in the absence of phase shift between the magnetic flux $\phi$ and the coil current $I_{BOB}$, which each reach a value of zero at the same time $t_3$.

Since the eddy currents are neglected, the magnetic circuit has a reluctance Rel that is, on the one hand, dependent on the position x of the movable core 34 and on the coil current $I_{BOB}$, and that is, on the other hand, related to the magnetic flux $\phi$ and to the coil current $I_{BOB}$ by the following relationship $\text{Rel}(x, I_{BOB}) \cdot \phi = N \cdot I_{BOB}$.

In other words, the magnetic flux $\phi$ is a function of the position x and of the coil current $I_{BOB}$, the magnetic flux $\phi$ being expressible in the form of an analytic relationship, or indeed, to obtain high precision, by a two-dimensional response surface generated by tools for simulating the magnetic circuit of the contactor 1.

In the vast majority of cases, the surface $\phi = f(x, I_{BOB})$ has a bijective character, i.e. for a given coil current $I_{BOB}$, to a given value of the position x corresponds a single value of the magnetic flux $\phi$. This allows an inverse function $x = g(\phi, I_{BOB})$ giving the value of the position x as a function of the magnetic flux $\phi$ and of the coil current $I_{BOB}$ to be reconstructed.

The surface $\phi = f(x, I_{BOB})$, or indeed its inverse function $x = g(\phi, I_{BOB})$, is stored in the memory of the electronic control device 40, for example in the form of a data table characteristic of the electromagnetic actuator 30, the data table defining a bijective relationship between the position x of the core 34, the coil flux $\phi$ and the coil current $I_{BOB}$.

The magnetic flux $\phi$ is also given by integration with respect to time of the equation the Math 1. The following equation Math 3 is then obtained:

$$\phi(t) = \int \frac{U_{BOB} - R_{BOB} \cdot I_{BOB}}{N} \cdot dt + \phi_0 \quad \text{[Math 3]}$$

in which $U_{BOB}$ and $I_{BOB}$ are measured, N, dt and $R_{BOB}$ are known and $\phi_0$ is an initial value of the magnetic flux $\phi$, at the start of the integration interval. In the context of the present invention, the integration interval preferably starts at the moment at which the electronic control device 40 commands the magnetic actuator 30 to open, i.e. at the time $t_2'$.

The magnetic flux $\phi$ may be computed using the equation Math 3 using numerical computing methods that are implemented by the electronic control device 40.

The shorter the integration time interval dt, in other words the shorter the integration stage, the smaller the computation error. The interval dt is for example proportional to the inverse of a clock frequency of the central processing unit of the electronic control device 40. According to some examples, the clock frequency of the device 40 is 1 kHz.

In order to compute the flux $\phi$ by integration of the measurements of $U_{BOB}$ and $I_{BOB}$ and to determine, using the inverse function $x=g(\phi, I_{BOB})$ the variation in the position x of the movable core 34, it is necessary to determine the initial flux $\phi_0$. An estimate $\hat{\phi}_0$ of the initial flux is defined.

A first method consists in determining the value of $\hat{\phi}_0$ using the known response surface $\phi=f(x, I_{BOB})$, by estimating an initial value of the position x, which is denoted estimate $\hat{x}_0$. The estimate $\hat{x}_0$ may for example be computed via the coil inductance $L_{BOB}$, which is known, the coil current $I_{BOB}$ being measured. Then, $\hat{\phi}_0=f(\hat{x}_0, I)$. As a variant, the core 34 being in abutment in the closed position, the estimate $\hat{x}_0$ may be evaluated from the geometry of the actuator 30.

However such a first method of determining the estimated value $\hat{x}_0$ of the position is relatively approximate and especially does not allow variability in magnetic-gap dimensions to be taken into account. For example, mating of surfaces or contamination of the gap may lead to a variation in this considered to be closed estimated position $\hat{x}_0$, this leading to an error in the estimate of the initial flux $\hat{\phi}_0$ and therefore to an error in the reconstruction of the position x in the opening phase.

A second method, referred to as the self-correction method, is based on the fact that the movable core 34 remains stationary in the closed position in the opening phase P4 provided that the coil current $I_{BOB}$ is higher than the stall current Is, i.e. before the stall time $t_2''$, provided that the core 34 remains stationary in its closed position.

In other words, at any time t comprised between $t_2'$ and $t_2''$, provided that the coil current $I_{BOB}$ is higher than the stall current Is, when the magnetic flux $\phi$ is computed using the equation Math 3 and when the position x at the time t is deduced using the inverse function $x=g(\phi, I_{BOB})$, if the computed position does not remain constant, in other words $x(t) \neq x(t_2')$, it means that there is an error in the estimate of the initial flux $\hat{\phi}_0$. The magnetic flux $\phi$ at the time t is then compensated for to correct this error, this compensation resulting in a re-estimation of the initial flux $\hat{\phi}_0$. The flux $\phi$ is corrected a plurality of times, in a plurality of successive computations and provided that the time t is comprised between $t_2'$ and $t_2''$, until the estimate of the initial flux $\hat{\phi}_0$ and the actual flux $\phi_0$ converge. As a result of the self-correction method, the error in the initial flux $\phi_0$ is compensated for in a precise manner.

Thus, when the coil current $I_{BOB}$ decreases below the stall current Is and the core 34 starts to move, precise knowledge of the magnetic flux allows, in its turn, the position x to be computed in a precise manner.

Figure 6:
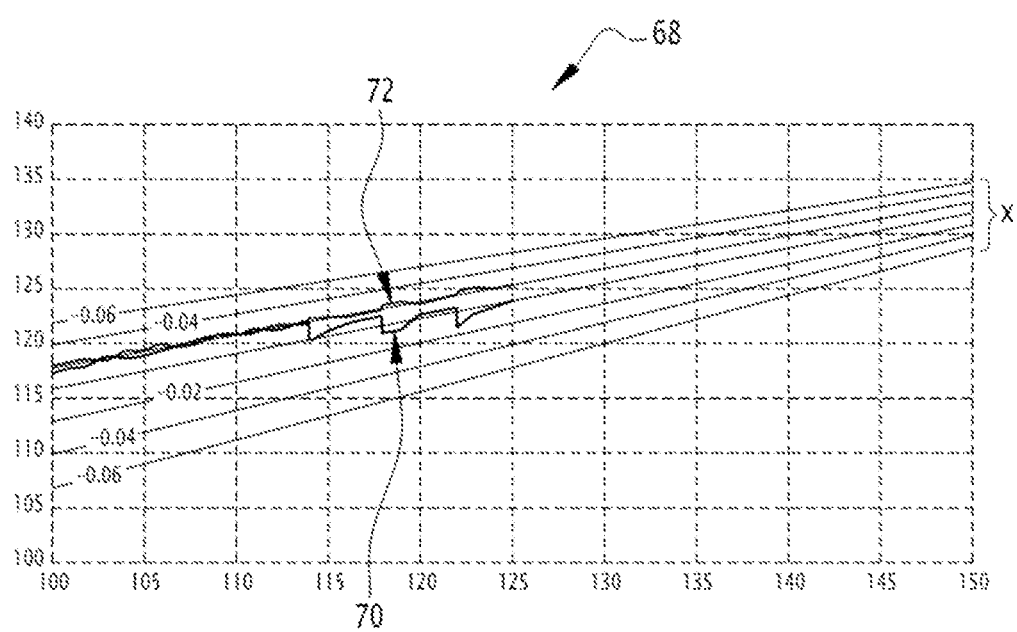
FIG. 6 is a graph illustrating one of the steps of the diagnosing method.

FIG. 6 shows a graph 68 illustrating an example of implementation of the self-correction method. In this graph 68, the curve 70 shows the magnetic flux $\phi$ computed with self-correction, depending on the coil current $I_{BOB}$ multiplied by the number of turns of the coil 32, the initial position x being set and the estimate of the initial flux $\hat{\phi}_0$ being erroneous. In the example, the estimated initial position is $\hat{x}_0=0$ mm, whereas the initial flux $\phi_0$ is the magnetic flux corresponding to a position x=+0.02 mm. It may be seen that there are divergences in the magnetic flux $\phi$ with respect to a characteristic corresponding to a set position x, leading to a series of self-corrections until the estimated flux and the real flux $\phi$ converge. The convergence of the estimated flux leads to a stable computed position x, which corresponds to the actual position x.

Figure 7:
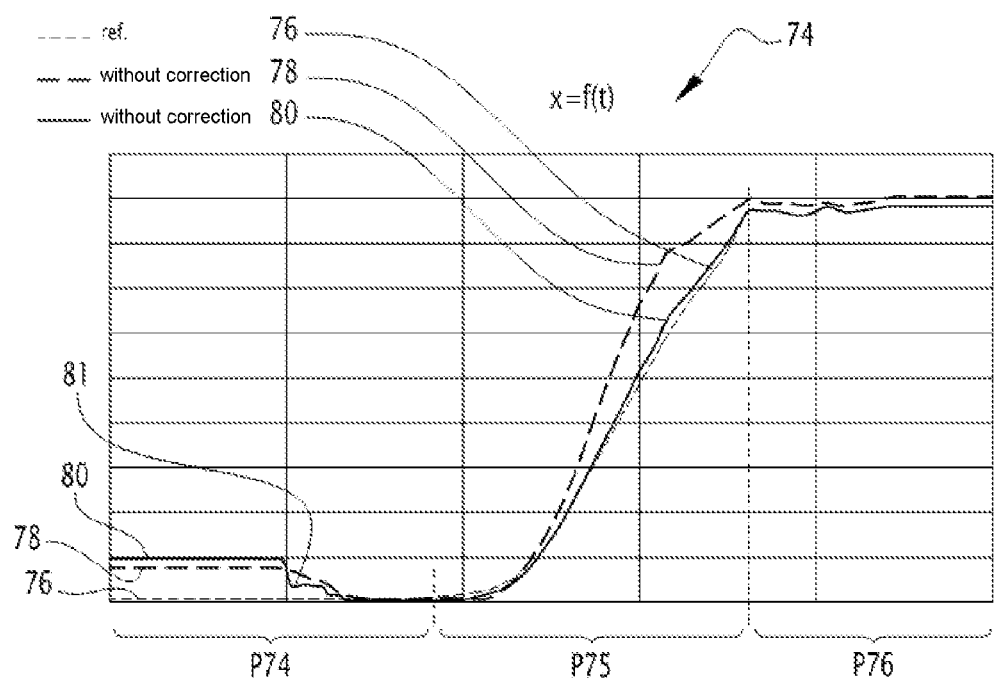
FIG. 7 is a graph illustrating a result of a method for diagnosing properties of the switching apparatus of FIG. 1, according to embodiments of the invention.

Curve 72 shows the magnetic flux $\phi$ computed with self-correction, without error in the initial flux $\phi_0$. In the example, the estimated initial position is $\hat{x}_0=+0.02$ mm, and the initial flux $\hat{\phi}_0$ is the magnetic flux corresponding to this position x=+0.02 mm. The computed flux indeed follows a characteristic of set position and requires no correction. FIG. 7 shows a graph 74 illustrating the effect that the self-correction method has on the determination of the position x. A curve 76 (dashed line) shows the variation in the position x, the position x being measured directly using a sensor of the position of the movable core 34 for the purposes of comparison with the results of the method described above. It will be understood that in practice the contactor 1 is normally devoid of such a position sensor.

In an initial phase P74, the measured position x remains constant. In a phase P75, after the initial phase P74, the core 34 moves from its closed position to its open position, and the position x varies. In a phase P76, after the phase P75, the core 34 is in its stable open position, and the position x is once again constant.

A curve 78 (thick dashed line) shows the variation in the position x, computed using the method described above without self-correction. The estimated initial flux $\hat{\phi}_0$ is erroneous and is not corrected.

A curve 80 shows the variation in the position x in a closing phase, computed using the method described above, with self-correction, the initial conditions being identical to those of the computation of the curve 78. The estimated initial flux $\hat{\phi}_0$ is erroneous but is corrected.

In an initial phase P74, the position x remains constant. Curve 80 contains stair-shaped changes 81 that result from the implementation of the self-correction procedure. Moreover, curve 80 joins curve 76 despite the uncertainty in the initial flux $\phi_0$. As a result, in phases P75 and P76, curve 80 corresponds better to curve 76 than curve 78, this demonstrating the positive effect of the self-correction method. It is not necessary to install a position sensor to reliably determine the variation in the position x as a function of time in the closing phase P2. The self-correction method is advantageously implemented in all cases.

Figure 8:
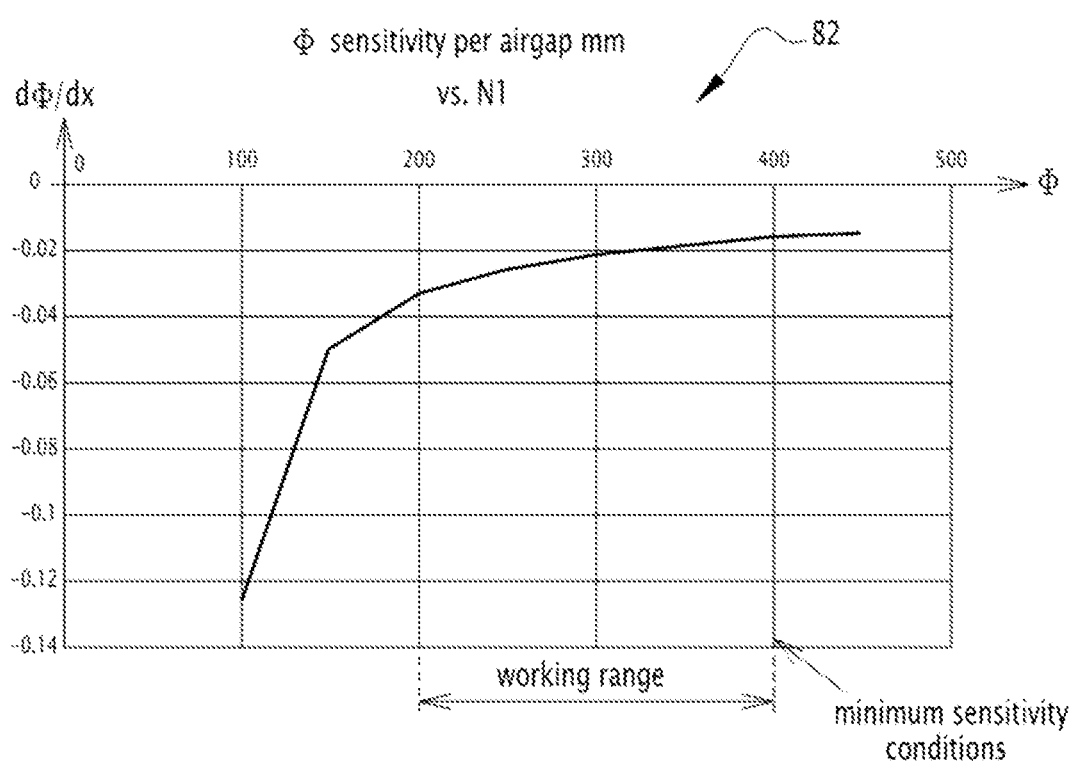
FIG. 8 is a graph showing the variation in the sensitivity of the magnetic flux of the electromagnetic actuator of FIG. 2 as a function of the electrical command current of the electromagnetic actuator.

The non-linear character of ferromagnetic materials means that the magnetic flux $\phi$ is less sensitive to variations in gap when the magnetic circuit, and in particular the coil 32, is saturated. This effect is illustrated in FIG. 8, which shows a graph 82 illustrating the sensitivity of the magnetic flux per mm of gap $$\frac{d\phi}{dx},$$

as a function of the magnetic flux $\phi$, which is equal to the coil current $I_{BOB}$ multiplied by the number of turns N. Thus, the higher the coil current $I_{BOB}$, the lower the sensitivity of the magnetic flux $\phi$ as a function of gap, or in other words as a function of the position x.

For this reason, after the order to open has been received, the electronic control device 40 commands the electromagnetic actuator 30 to open when the coil current $I_{BOB}$ is as high as possible, i.e. higher than or equal to 80% of the high threshold $I_2$, preferably higher than 95%, and more preferably higher than 98% of the high threshold $I_2$. This allows both the magnetic circuit to be saturated and more time to be provided to implement the self-correction method.

Figure 9:
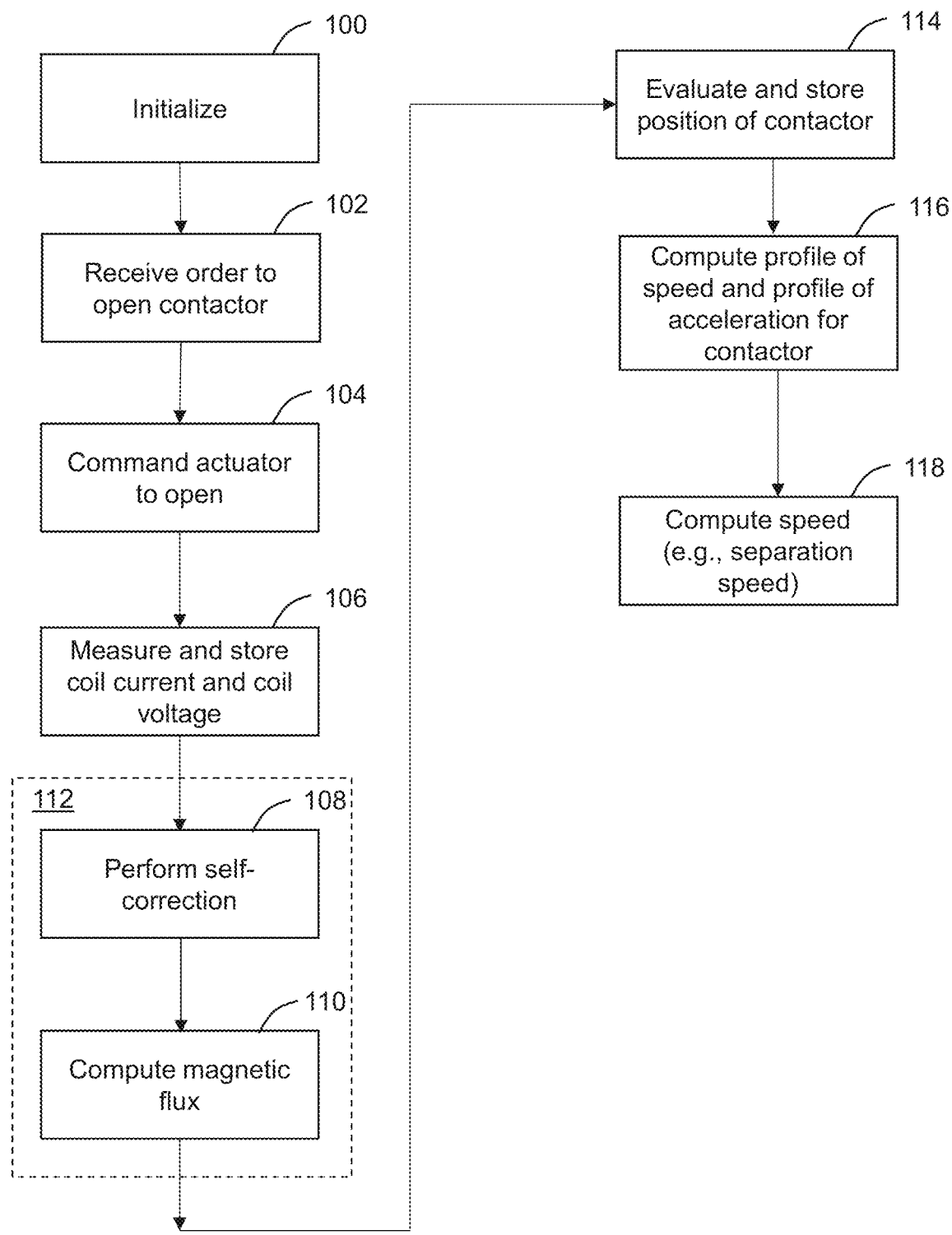
FIG. 9 is a chart showing steps of a method for diagnosing properties of the switching apparatus of FIG. 1, according to embodiments of the invention.

An example of operation of a method for estimating properties of the contactor 1 according to one preferred embodiment will now be described with reference to FIG. 9. However, as a variant, the steps of this method could be executed in a different order. Some steps could be omitted. The described example does not prevent, in other embodiments, other steps from being implemented conjointly and/or sequentially with the described steps.

In a step 100, the method is initialized while the contactor 1 is initially in a stable closed state, in the holding phase P3 for example. The electronic control device 40 is waiting for an order to open the contactor 1.

Next, in a step 102, the electronic control device 40 receives an order to open the contactor 1. The time $t_2$ of reception of the order to open is the start of the opening phase P4.

Next, in a step 104, the electronic control device 40 commands, at the time $t_2'$, the electromagnetic actuator 30 to open. The command to open here consists in dropping the command voltage across the terminals of the coil 32 to zero.

Preferably, the electronic control device 40 commands the electromagnetic actuator 30 to open when the coil current $I_{BOB}$ is higher than or equal to 80%, preferably higher than 95%, and more preferably higher than 98%, of the high threshold $I_2$.

During the holding phase P3 and up to the time $t_2'$, the coil voltage $U_{BOB}$ varies periodically at a frequency F3, here equal to 100 Hz; in other words, the periodic variation in the coil voltage defines a period equal to 1/F3, i.e. here 10 ms.

Advantageously, the electronic control device 40 commands the electromagnetic actuator 30 to open at the latest at the end of a predefined duration after the order to open is received. According to some examples, the predefined duration is equal to one period of the coil voltage $U_{BOB}$, i.e. here 10 ms.

Next, in a step 106, the electronic control device 40 measures and stores the coil current $I_{BOB}$ and coil voltage $U_{BOB}$, for example until the contactor 1 reaches its open position, or indeed for a predefined length of time of storage, which length of time is stored in the electronic control device. This length of time of storage is for example equal to 5 periods of a 50 Hz supply current, i.e. to 100 ms.

Next, the method comprises a step 112 of computing and storing the magnetic flux $\phi$ flowing through the coil 32.

Step 112 comprises a substep 110 in which the magnetic flux $\phi$ is computed by integration of the stored values of the coil current $I_{BOB}$ and coil voltage $U_{BOB}$ and of values, stored beforehand in the electronic control device 40, of coil resistance $R_{BOB}$ and coil inductance $L_{BOB}$.

Step 112 advantageously comprises an initial self-correction substep 108, after the substep 110, the self-correction substep consisting in, provided that the coil current $I_{BOB}$ is higher than a low threshold $I_1$ and that the core 34 is still in closed position, estimating an initial value of the magnetic flux $\phi_0$, the computation by integration of the magnetic flux in the substep 110 taking into account the value of the initial flux $\phi_0$ computed in the self-correction substep 108.

According to some examples, the self-correction subset 108 lasts from the time $t_2'$ to the stall time $t_2''$, whereas substep 110 starts at the time $t_2''$.

Next, the method comprises a step 114 consisting in evaluating and storing the position x of the contactor 1 on the one hand on the basis of the stored values of the magnetic flux and of the coil current $I_{BOB}$ and, on the other hand, depending on a data table characteristic of the electromagnetic actuator 30, the data table being stored beforehand in the electronic control device 40 and defining a bijective relationship between the position x of the core 34, the magnetic flux and the coil current $I_{BOB}$.

Figure 10:
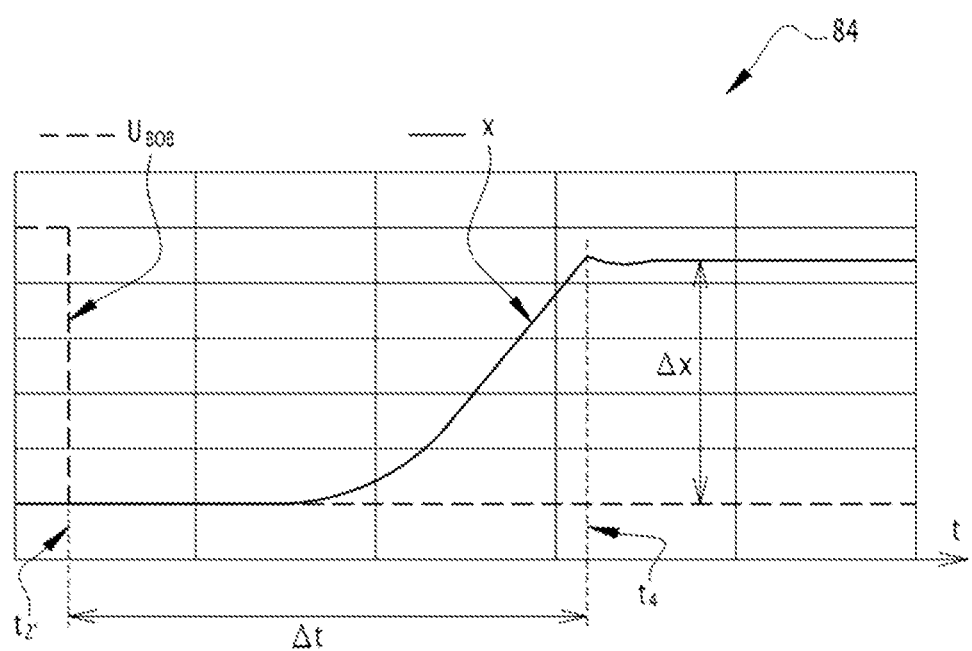
FIG. 10 is a graph showing one example of the result of the method according to the invention, in a phase of opening the switching apparatus of FIG. 1.

FIG. 10 shows a graph 84 illustrating the variation in the position x and in the coil voltage $U_{BOB}$ in an opening phase P4. A time $t_4$ is defined as being a time at which the movable core 34 is stably in its open position. A travel $\Delta x$ of the movable core 34 is also defined as being equal to a difference between the positions x at the times $t_2'$ and $t_4$, i.e. to the difference in position x between the open position and the closed position.

A release time $\Delta t$ is also defined as being equal to the time passed between the time $t_2'$, at which the electronic control device 40 commands the electromagnetic actuator 30 to open, and the time $t_4$, at which the electromagnetic actuator 30 is stably in its open position.

Knowledge of the position x allows various conclusions to be drawn as to the state of the contactor 1.

According to a first example, the method is configured to compare the travel $\Delta x$ of the movable core 34 to a reference value stored in the electronic control device 40, in order to detect potential defects of mechanical nature.

According to another example, the method is configured to verify the absence of friction or blockages of mechanical origin by comparing the release time $\Delta t$ to a reference time stored in the electronic control device 40.

In a step 116 of the method, a profile of the speed v of movement of the contactor 1 and a profile of the acceleration a of the contactor 1 are computed by differentiation with respect to time of the values of position x stored in step 114. The profiles of speed v and acceleration a are stored in the electronic control device 40. By extension, the profiles of the speed v and acceleration a of the contactor 1 are also profiles of the speed v and acceleration a of the electromagnetic actuator 30 or of the movable core 34.

Next, in a step 118, the electronic control device 40 is configured to compute a speed, referred to as the "separation" speed, equal to a speed v of the contactor 1 when the position x of the contactor 1 has reached a position referred to as the "max overtravel" position and denoted Emax, corresponding to a movement of the core 34 from the closed position to the open position. In practice, this movement depends on the geometry of the actuator 30 and is generally comprised between 0.5 mm and 3 mm, and for example equal to 2 mm. Preferably, the electronic control device 40 is configured to generate an alarm if the separation speed is lower than a threshold stored beforehand in the electronic control device 40.

Figure 11:
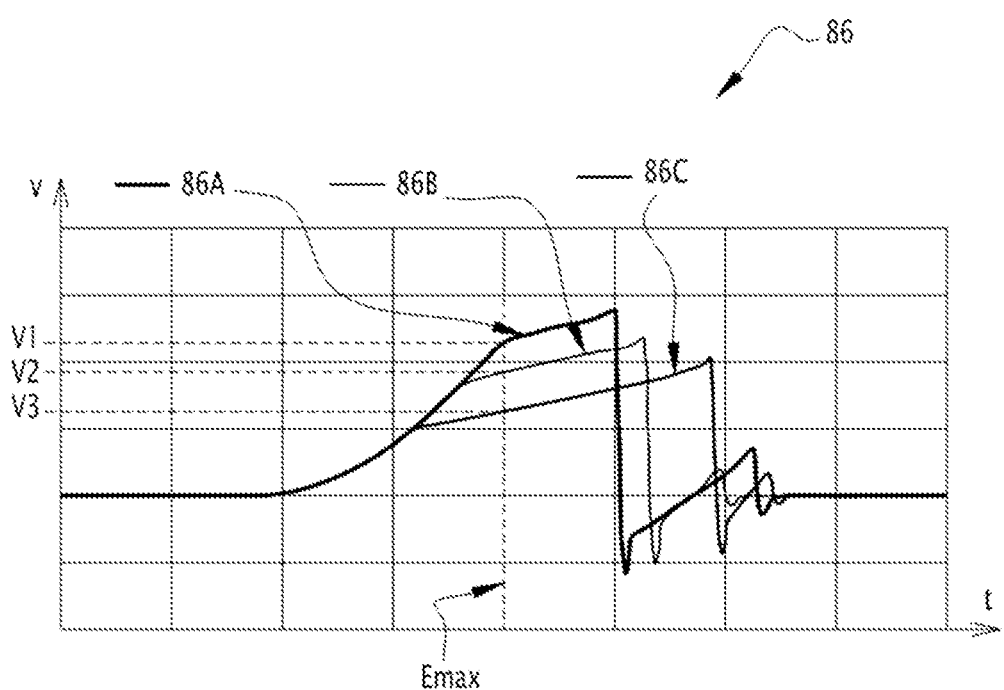
FIG. 11 is a graph showing another example of the result of the method according to the invention, in a phase of opening the switching apparatus of FIG. 1.

FIG. 11 shows a graph 86 illustrating, in an opening phase P4, three speed profiles 86A, 86B and 86C, corresponding to the profile of the speed v of the core 34 of three contactors 1 of identical model but having different wear states: new, slightly worn and worn, respectively.

The separation speed of the core 34 of the new, slightly worn and worn contactor 1 is defined as being a separation speed V1, V2 and V3, respectively.

The effect of the wear of the contactor on the separation speed is observable by comparing the separation speeds V1, V2 and V3. The more worn the contactor 1, the lower the separation speed. It is thus possible to define a minimum separation-speed threshold below which the electronic control device 40 generates an alarm in order to signal to a user that maintenance must be scheduled.

For a contactor 1 in a good state, from the stall time $t_2''$, the magnetic forces are never higher than the forces due to the return member 36, this resulting in a speed v that strictly increases until the core 34 reaches abutment at the end of its travel in the open position. In the case of a worn conductor 1, in particular when the contact pads 29 are worn and the surface of the contact pads 29 is damaged, micro-welds form between the pads 29 of the movable and fixed contacts 24, 28 in the holding phase P3. When the contactor 1 is opened, breakage of the micro-welds slows the movement of the movable core 34, and the speed v contains a decreasing segment before the core 34 reaches abutment in the open position.

Figure 12:
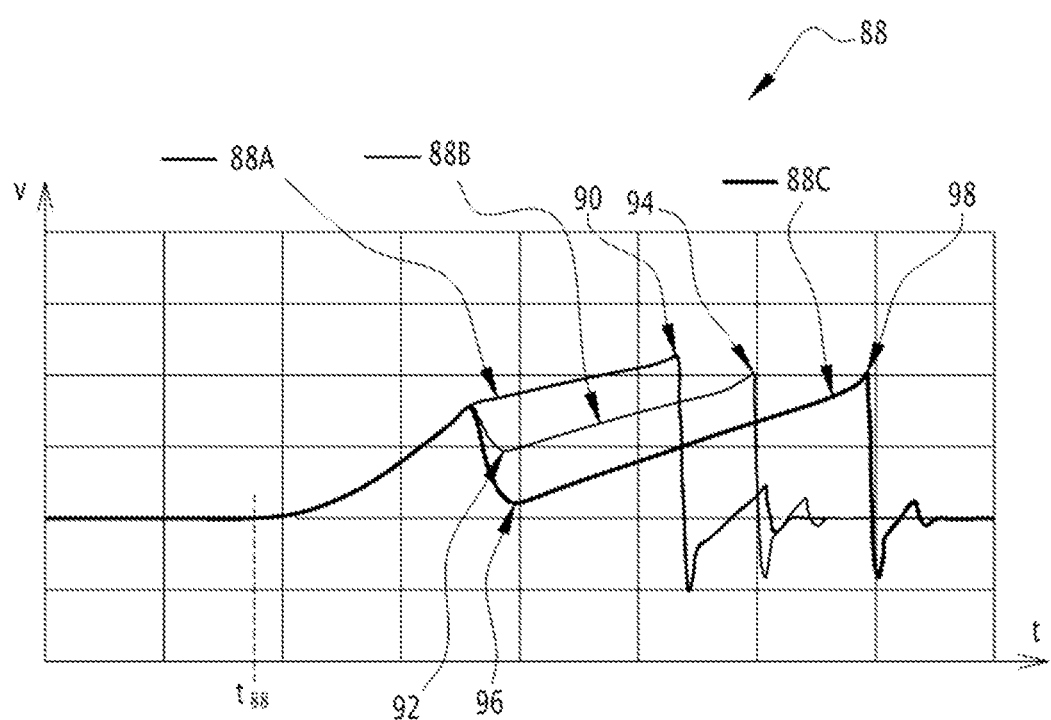
FIG. 12 is a graph showing another example of the result of the method according to the invention, in a phase of opening the switching apparatus of FIG. 1.

FIG. 12 shows a graph 88 illustrating, in an opening phase, three speed profiles 88A, 88B and 88C corresponding to the speeds v of the cores 34 of three contactors 1 of identical model but having different micro-weld states: healthy product, light μ-weld and strong μ-weld, respectively. The three speed profiles 88A, 88B et 88C are synchronised, i.e. the movement starts at the same time $t_{88}$. In other words, the speeds are zero up to all the time $t_{88}$.

The profile 88A, corresponding to the healthy contactor 1, increases monotonically from the time $t_{88}$ to a peak 90 at the point where the core 34 reaches abutment.

The profile 88B, corresponding to the contactor 1 with light micro-welds, has a peak 94 at the point where the core 34 reaches abutment. However, the profile 88B does not increase monotonically from the time $t_{88}$ to the peak 94 but exhibits, between the time $t_{88}$ and the peak 94, a decreasing segment, followed by another increasing segment. A junction between the decreasing and increasing segments has a horizontal tangent and defines a local minimum 92 of the profile 88B. In other words, the speed profile 88B contains a local minimum 92 between the time $t_{88}$ of the start of the movement and a peak 94 at the point where the core 34 reaches abutment.

The profile 88C, corresponding to the contactor 1 with strong micro-welds, contains a local minimum 96 between the time $t_{88}$ of the start of the movement and a peak 98 at the point where the core 34 reaches abutment, the local minimum 96 being more marked than the local minimum 92 of the profile 88B. In other words, the stronger the micro-welds, the more marked a local minimum in the speed v between the time $t_{88}$ of the start of the movement of the core 34 and the point where the core 34 reaches abutment in the open position.

More generally, the diagnosing method according to the invention makes it possible to precisely determine the profile of the position x of the movable core 34 as a function of time, and profiles of velocity v and acceleration a, which profiles are derived from the profile of the position x. This information may be combined in many ways with a view to monitoring wear of specific components of the contactor 1, for example, the contact pads 29, or indeed the mechanism of the electromagnetic actuator 30.

In the illustrated example, the electronic control device 40 performs both the function of controlling the closing device 30 and the function of implementing the diagnosing method according to the invention.

As a variant (not shown) the diagnosing method is implemented by a specific electronic device, which is added to an existing contactor during a maintenance operation. Such a specific device requires, to implement the diagnosing method according to the invention, only measurements of the coil current $I_{BOB}$ and coil voltage $U_{BOB}$.

According to another variant, when a contactor 1 comprises an electronic control device 40 that is not configured to implement the diagnosing method according to the invention, if sensors of coil current and coil voltage are present, it is possible to configure the electronic control device 40 of the contactor 1 so that it is able to implement the diagnosing method according to the invention, for example by physically replacing the electronic control device 40 or indeed, where appropriate, by changing the computational code of the electronic control device 40.

The embodiments and the variants mentioned above may be combined with one another to create new embodiments of the invention.

The invention claimed is:

1. A method for diagnosing an operating state of a switching apparatus, the switching apparatus being configured to be coupled to an electrical conductor and comprising:

separable contacts that are associated with the electrical conductor and that are driven by an electromagnetic actuator comprising a coil connected to an electronic control device, the electronic control device being configured to apply a coil command voltage across the terminals of the coil, and sensors that are configured to measure the coil voltage and a magnitude of a coil current flowing through the coil, the method comprising diagnosing an operating state of the switching apparatus which comprises a contactor, the diagnosing including:

a) receiving an order to open the switching apparatus, the switching apparatus initially being in a closed state, the order to open being received by the electronic control device;

b) after the order to open has been received, commanding the electromagnetic actuator to open, by means of the electronic control device;

c) as the switching apparatus switches to the open state, measuring values of the coil voltage and coil current using the sensors and storing the values of the coil voltage and coil current;

d) computing and storing values of a magnetic flux passing through the coil based on the stored values of the coil current and coil voltage and on values of the resistance and inductance of the coil that are stored beforehand in the electronic control device; and e) on the basis of the stored values of the magnetic flux and coil current, evaluating and storing positions of a core of the electromagnetic actuator depending on a data table characteristic of the electromagnetic actuator, the data table being stored beforehand in the electronic control device and defining a bijective relationship between the position of the core, the magnetic flux and the coil current, wherein computing values of the magnetic flux comprises an initial substep, referred to as the self-correction substep, followed by a computing substep, the self-correction substep comprising applying a current to the coil higher than a low threshold, itself strictly higher than a current referred to as the "stall" current, below which the movable core is repulsed to the open position by a return member of the electromagnetic actuator, and evaluating and storing an initial value of the magnetic flux, said value being referred to as the "initial flux", so that, when the coil current decreases below the stall current, the computation of the magnetic flux in a computing phase takes into account the value of the initial flux.

2. The method according to claim 1, wherein the electronic control device is configured to, when the switching apparatus is in the closed state, make the coil voltage vary so that the coil current varies between the low threshold and a high threshold, which is strictly higher than the low threshold, and wherein, after the order to open has been received, the electronic control device commands the electromagnetic actuator to open when the coil current is higher than or equal to 80% of the high threshold so as to allow both a magnetic circuit associated with the coil to be saturated and time to implement the self-correction substep.

3. The method according to claim 2, wherein the coil voltage is made to vary periodically by chopping, the coil current also varying periodically between the low and high thresholds, and wherein, after the order to open has been received, the electronic control device commands the electromagnetic actuator to open at the latest at the end of a predefined duration after the order to open is received, the predefined duration being equal to one period of the coil voltage.

4. The method according to claim 1, wherein the electronic control device is configured to compute a time, referred to as the "release" time, equal to the time passed between the time at which the electronic control device commands the electromagnetic actuator to open and the time at which the electromagnetic actuator reaches the open position.

5. The method according to claim 1, further comprising computing, by derivation with respect to time of the values of the position of the switching apparatus stored in the electronic control device, a profile of the speed of movement of the switching apparatus and a profile of the acceleration of the switching apparatus, and storing the speed and acceleration profiles of the switching apparatus in the electronic control device.

6. The method according to claim 5, further comprising computing a value of a speed, referred to as the "separation" speed, equal to a speed of movement of the core when the core is in a predefined overtravel position corresponding to a movement of the core, from its closed position to its open position, substantially equal to 2 mm from the closed position.

7. The method according to claim 5, further comprising detecting, in a phase of opening of the switching apparatus, a local minimum in the speed of the core between the start of the movement of the core and the moment at which the core reaches abutment in the open position.

8. The method according to claim 1, wherein the magnetic flux is computed by integration of the stored values of the coil current and coil voltage and of a value of the resistance of the coil that is stored beforehand in the electronic control device, and by using a value related to the inductance of the coil stored beforehand in the electronic control device.

9. The method according to claim 1, wherein the positions are evaluated and stored in relation to time to provide a profile of the position of the core of the electromagnetic actuator as a function of time, and the profile of the position of the core or information derived from the profile is evaluated to monitor wear of the switching apparatus or a component thereof.

10. The method according to claim 1, wherein
a travel of the core of the electromagnetic actuator of the contactor between the closed state and the open state is evaluated on the basis of the stored positions of the core; and
the travel of the core of the electromagnetic actuator is compared to a reference value, which is stored beforehand in the electronic control device, so as to detect for a potential defect of a mechanical nature of the contactor.

11. The method according to claim 1, wherein computing values of the magnetic flux compensates for variability of magnetic-gap dimensions of the contactor.

12. The method according to claim 11, wherein computing values of the magnetic flux includes:
compensating an estimated initial magnetic flux to correct for variability of magnetic-gap dimensions of the contactor.

13. An electrical switching apparatus comprising:
separable contacts that are moved between an open position and a closed position by an electromagnetic actuator comprising a coil and a movable core that is attached to the separable contacts, the switching apparatus having a structure that limits the generation of eddy currents;
a command circuit for controlling the voltage across the terminals of the coil, said voltage being referred to as the "coil voltage", the command circuit comprising a device referred to as the "release" device, which may be selectively activated in order to make drop the electrical current flowing through the coil, which is referred to as the "coil current", the coil voltage and the release device being activated or deactivated depending on the states of the command circuit;
sensors for measuring the coil current and coil voltage; and
an electronic control device that is configured to receive orders to open and close the switching apparatus, to receive the values of the measurements of coil current and coil voltage, and to control the states of the command circuit;
wherein the switching apparatus comprises a contactor and is configured to diagnose an operating state of the switching apparatus, by implementing a diagnosing method comprising:
a) receiving an order to open the switching apparatus;
b) commanding the electromagnetic actuator to open;
c) measuring values of the coil voltage and coil current using the sensors and storing the values of the coil voltage and coil current;
d) computing and storing values of a magnetic flux passing through the coil based on the stored values of the coil current and coil voltage and on values, which are stored beforehand in the electronic control device, of the resistance and inductance of the coil; and
e) on the basis of the stored values of the magnetic flux and coil current, evaluating and storing positions of the core depending on a data table characteristic of the electromagnetic actuator, the data table being stored beforehand in the electronic device and defining a bijective relationship between the position of the core, the magnetic flux and the coil current,
wherein computing values of the magnetic flux comprises an initial substep, referred to as the self-correction substep, followed by a computing substep, the self-correction substep comprising applying a current to the coil higher than a low threshold, itself strictly higher than a current referred to as the "stall" current, below which the movable core is repulsed to the open position by a return member of the electromagnetic actuator, and evaluating and storing an initial value of the magnetic flux, said value being referred to as the "initial flux", so that, when the coil current decreases below the stall current, the computation of the magnetic flux in a computing phase takes into account the value of the initial flux.

14. The electrical switching apparatus according to claim 13, wherein the magnetic flux is computed by integration of the stored values of the coil current and coil voltage and of a value of the resistance of the coil that is stored beforehand in the electronic control device, and by using a value related to the inductance of the coil stored beforehand in the electronic control device.

15. The electrical switching apparatus according to claim 13, wherein the positions are evaluated and stored in relation to time to provide a profile of the position of the core of the electromagnetic actuator as a function of time, and the profile of the position of the core or information derived from the profile is evaluated to monitor wear of the switching apparatus or a component thereof.

16. The electrical switching apparatus according to claim 13, wherein a travel of the core of the electromagnetic actuator of the contactor between a closed state and an open state is evaluated on the basis of the stored positions of the core; and the travel of the core of the electromagnetic actuator is compared to a reference value, which is stored beforehand in the electronic control device, so as to detect for a potential defect of a mechanical nature of the contactor.

17. The electrical switching apparatus according to claim 13, wherein computing values of the magnetic flux compensates for variability of magnetic-gap dimensions of the contactor.

18. The electrical switching apparatus according to claim 17, wherein computing values of the magnetic flux includes:
compensating an estimated initial magnetic flux to correct for variability of magnetic-gap dimensions of the contactor.

* * * * *